(12) United States Patent
Lee et al.

(10) Patent No.: US 10,854,250 B2
(45) Date of Patent: Dec. 1, 2020

(54) MEMORY DEVICE INCLUDING A CIRCUIT FOR DETECTING WORD LINE DEFECT AND OPERATING METHOD THEREOF

(71) Applicant: Samsung Electronics Co., Ltd., Suwon-si (KR)

(72) Inventors: Jae-Yun Lee, Anyang-si (KR); Joon Soo Kwon, Seoul (KR); Byung Soo Kim, Yongin-si (KR); Su-Yong Kim, Hwaseong-si (KR); Sang-Soo Park, Hwaseong-si (KR); Il Han Park, Suwon-si (KR); Kang-Bin Lee, Suwon-si (KR); Jong-Hoon Lee, Hwaseong-si (KR); Na-Young Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 25 days.

(21) Appl. No.: 15/997,964

(22) Filed: Jun. 5, 2018

(65) Prior Publication Data

US 2019/0130953 A1 May 2, 2019

(30) Foreign Application Priority Data

Oct. 26, 2017 (KR) .......................... 10-2017-0140000

(51) Int. Cl.
*G11C 8/08* (2006.01)
*G11C 29/12* (2006.01)
(Continued)

(52) U.S. Cl.
CPC ................ *G11C 8/08* (2013.01); *G06F 3/061* (2013.01); *G06F 3/0679* (2013.01); *G11C 5/145* (2013.01);
(Continued)

(58) Field of Classification Search
CPC ....... G11C 8/08; G11C 16/0483; G11C 16/10; G11C 16/3445; G11C 16/3459;
(Continued)

(56) References Cited

U.S. PATENT DOCUMENTS 6,279,070 B1  8/2001  Jeong et al.
6,469,933 B2  10/2002  Choi et al.
(Continued)

FOREIGN PATENT DOCUMENTS

KR  2009-0090180 A  8/2009
KR  2014-0014518 A  2/2014

*Primary Examiner* — Mohammed A Bashar
(74) *Attorney, Agent, or Firm* — Muir Patent Law, PLLC

(57) ABSTRACT

A memory device comprises a memory cell array including a first memory cell disposed on a substrate and a second memory cell above the first memory cell; a first word line connected to the first memory cell and a second word line connected to the second memory cell, the second word line disposed above the first word line; and a word line defect detection circuit configured to monitor a number of pulses of a pumping clock signal while applying a first voltage to the first word line to detect a defect of the first word line. The voltage generator is configured to apply a second voltage different from the first voltage to the second word line for programming the second memory cell when the number of pulses of the pumping clock signal is smaller than a reference value.

18 Claims, 19 Drawing Sheets

(51) Int. Cl.
*G11C 16/30* (2006.01)
*G11C 16/08* (2006.01)
*G11C 16/34* (2006.01)
*G11C 16/10* (2006.01)
*G11C 16/04* (2006.01)
*G06F 3/06* (2006.01)
*G11C 5/14* (2006.01)
*G11C 16/12* (2006.01)
*G11C 16/14* (2006.01)
*G11C 29/02* (2006.01)

(52) U.S. Cl.
CPC .......... *G11C 16/0483* (2013.01); *G11C 16/08* (2013.01); *G11C 16/10* (2013.01); *G11C 16/12* (2013.01); *G11C 16/14* (2013.01); *G11C 16/30* (2013.01); *G11C 16/3445* (2013.01); *G11C 16/3459* (2013.01); *G11C 29/025* (2013.01); *G11C 29/12005* (2013.01); *G11C 29/12015* (2013.01); *G11C 2029/1202* (2013.01)

(58) Field of Classification Search
CPC ... G11C 16/08; G11C 29/12015; G11C 16/30; G11C 29/12005; G11C 29/025; G11C 16/14; G11C 16/12; G11C 5/145; G11C 2029/1202; G06F 3/0679; G06F 3/061
See application file for complete search history.

(56) References Cited

U.S. PATENT DOCUMENTS

| | | |
|---|---|---|
| 7,688,631 B2 | 3/2010 | Kim et al. |
| 7,697,327 B2 | 4/2010 | Kim et al. |
| 8,295,095 B2 | 10/2012 | Jones |
| 8,379,454 B2 | 2/2013 | Kochar et al. |
| 8,432,744 B2 | 4/2013 | Umezawa et al. |
| 8,879,330 B1 | 11/2014 | Mu et al. |
| 9,189,174 B2 | 11/2015 | Lee et al. |
| 9,529,663 B1 | 12/2016 | Srinivasan et al. |
| 2014/0032821 A1* | 1/2014 | Lee .................. G11C 5/145 711/103 |
| 2014/0071756 A1* | 3/2014 | Iwai ................ H01L 27/1157 365/185.11 |
| 2016/0232985 A1 | 8/2016 | Sabde et al. |
| 2017/0169896 A1 | 6/2017 | Kavalipurapu et al. |

* cited by examiner

MEMORY DEVICE INCLUDING A CIRCUIT FOR DETECTING WORD LINE DEFECT AND OPERATING METHOD THEREOF

This application claims priority from Korean Patent Application No. 10-2017-0140000 filed on Oct. 26, 2017 in the Korean Intellectual Property Office, the disclosure of which is incorporated herein by reference in its entirety.

BACKGROUND

1. Field of the Invention

The present disclosure relates to a memory device including a circuit for detecting word line defect and an operating method thereof.

2. Description of the Related Art

A memory device is a storage device which may store data and may read the data when necessary. The memory device may be roughly classified into a nonvolatile memory (NVM) in which stored data does not disappear even if a power is not supplied, and a volatile memory (VM) in which the stored data disappears when the power is not supplied.

In order to control a plurality of memory cells disposed in the memory device, various wirings may be disposed and used inside the memory device. Examples of these wirings may include a word line and a bit line connected to a memory cell.

As the size of the memory device has been increasingly miniaturized, the interval between the wirings disposed therein is also narrowed. As a result, various kinds of defects such as a bridge defect in which the wirings to be insulated from each other are electrically connected are likely to occur. Since these defects degrade the operation performance of the memory device, a research for improving the defects is desired.

SUMMARY

An aspect of the present disclosure provides a memory device having improved data storage reliability and operation performance.

Another aspect of the present disclosure provides a method for operating the memory device with improved data storage reliability and operation performance.

According to some aspects of the present disclosure, a memory device is provided. The memory device comprises a memory cell array including a first memory cell disposed on a substrate and a second memory cell above the first memory cell; a first word line connected to the first memory cell and a second word line connected to the second memory cell, the second word line disposed above the first word line; a clock generator configured to generate a pumping clock signal when a pumping voltage is lower than a reference pumping voltage; a voltage generator configured to generate the pumping voltage responsive to the pumping clock signal, and generate a first voltage based on the pumping voltage and a second voltage different from the first voltage; and a word line defect detection circuit configured to monitor a number of pulses of the pumping clock signal while applying the first voltage to the first word line to detect a defect of the first word line. The voltage generator is configured to apply the second voltage to the second word line for programming the second memory cell when the number of pulses of the pumping clock signal is smaller than a reference value.

According to some aspects of the present disclosure, a method for operating a memory device is provided. The method for operating the memory device comprises providing a memory cell array which includes a first memory cell disposed on a substrate, a first word line connected to the first memory cell, a second memory cell disposed above the first memory cell, and a second word line disposed above the first word line and connected to the second memory cell; generating a pumping clock signal when a pumping voltage is lower than a reference pumping voltage; generating the pumping voltage responsive to the pumping clock signal, a first voltage based on the pumping voltage, and a second voltage different from the first voltage; detecting a defect of the first word line by monitoring a first number of pulses of the pumping clock signal while applying the first voltage to the first word line; and when the first number of pulses of the pumping clock signal is smaller than a first reference value, programming the second memory cell by applying the second voltage to the second word line.

According to some aspects of the present disclosure, a memory device is provided. The memory device comprises a memory cell array including a first memory cell disposed on a substrate, a second memory cell disposed above the first memory cell, and a third memory cell disposed above the second memory cell; a first word line connected to the first memory cell, a second word line connected to the second memory cell, and a third word line connected to the third memory cell, the second word line disposed above the first word line, the third word line disposed above the second word line; a clock generator configured to generate a pumping clock signal when a pumping voltage is lower than a reference pumping voltage; a voltage generator configured to generate the pumping voltage responsive to the pumping clock signal, and generate a first program voltage based on the pumping voltage and a second program voltage different from the first program voltage; and a word line defect detection circuit configured to monitor a first number of pulses of the pumping clock signal while applying the first program voltage to the first word line to detect a defect of the first word line. When the first number of pulses of the pumping clock signal is smaller than a first reference value, the word line defect detection circuit is configured to monitor a second number of pulses of the pumping clock signal while applying the first program voltage to the second word line to detect a defect of the second word line. The voltage generator is configured to apply the second program voltage to the third word line for programming the third memory cell when the second number of pulses of the pumping clock signal is smaller than the first reference value.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
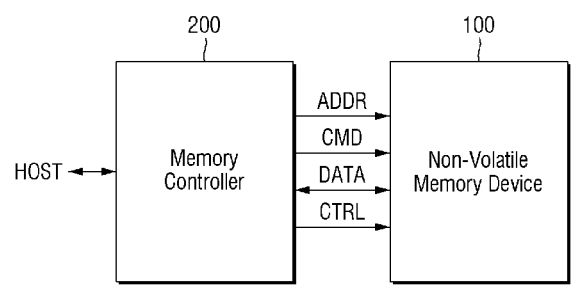
FIG. 1 is a block diagram illustrating a nonvolatile memory system according to some embodiments.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. In the drawings, the thickness of layers and regions are exaggerated for clarity.

FIG. 1 is a block diagram illustrating a nonvolatile memory system according to some embodiments.

Referring to FIG. 1, a nonvolatile memory system includes a memory controller 200 and a nonvolatile memory device 100. Examples of the nonvolatile memory system illustrated in FIG. 1 may include a data storage medium based on a flash memory, such as a memory card, a USB memory, and an SSD (Solid State Drive), but are not limited to these examples.

The memory controller 200 may be connected to the host (HOST) and the nonvolatile memory device 100. The memory controller 200 may be configured to access the non-volatile memory device 100 in response to a request from the host (HOST), as illustrated. The memory controller 200 may be configured to provide an interface between the non-volatile memory device 100 and the host (HOST). Further, the memory controller 200 may be configured to drive a firmware for controlling the nonvolatile memory device 100.

The memory controller 200 may control the operation of the nonvolatile memory device 100. Specifically, the memory controller 200 may provide a command (CMD), an address (ADDR), a control signal (CTRL), and data (DATA) along an input/output line connected to the nonvolatile memory device 100.

The control signal (CTRL) provided to the nonvolatile memory device 100 by the memory controller 200 may include, for example, but is not limited to, a chip enable (CE), a light enable (WE), a read enable (RE) and the like.

The memory controller 200 may also include an error correction code (ECC) circuit which corrects error bits of the nonvolatile memory device 100. The ECC circuit may correct the error bit included in the data. However, the present disclosure is not limited thereto, and the ECC circuit may be provided as part of the nonvolatile memory device 100 as necessary.

Each of the memory controller 200 and the nonvolatile memory device 100 may be provided as one chip, one package, one module, or the like. For example, the memory controller 200 and the nonvolatile memory device 100 may be mounted, using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

Hereinafter, the configuration of the nonvolatile memory device 100 will be described more specifically with reference to FIG. 2.

Figure 2:
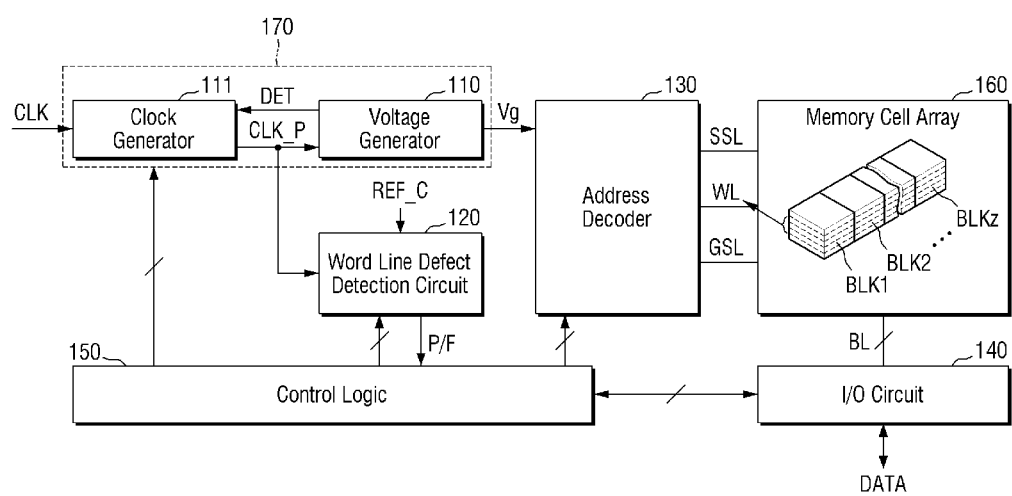
FIG. 2 is a block diagram for explaining the nonvolatile memory device of FIG. 1 according to some embodiments.

FIG. 2 is a block diagram for explaining the nonvolatile memory device of FIG. 1 according to some embodiments.

Referring to FIG. 2, the nonvolatile memory device 100 includes a word line defect detection circuit 120, an address decoder 130, an input/output circuit 140, a control logic 150, a memory cell array 160, and a voltage generating unit 170.

The nonvolatile memory device 100 may include, but is not limited to, for example, a NAND flash memory, a vertical type NAND (VNAND), a NOR flash memory, a resistive random access memory (RRAM), a phase-change memory (PRAM), a magneto resistive random access memory (MRAM), a ferroelectric random access memory (FRAM), a spin transfer torque random access memory (STT-RAM), and the like. Hereinafter, the technical idea of the present disclosure will be described by taking as an example in which the nonvolatile memory device 100 is a vertical NAND flash memory (VNAND). However, the scope according to the technical idea of the present disclosure is not limited to these examples. That is, the embodiments according to the technical idea of the present disclosure can be applied to the nonvolatile memory described above.

The word line defect detection circuit 120 may detect a defect of the wirings disposed in a memory cell array 160. Specifically, the word line defect detection circuit 120 may detect defects existing in a word line and a bit line disposed in the memory cell array 160, for example, using a pumping clock signal (CLK_P). In this way, when the word line defect detection circuit 120 detects a defect, the word line defect detection circuit 300 may provide defect information to the control logic 150.

The voltage generating unit 170 may include a voltage generator 110 and a clock generator 111.

The voltage generator 110 may generate operating voltages (Vg) required for operation of the nonvolatile memory device 100. Examples of the operating voltages (Vg) include, but are not limited to, program voltage, pass voltage, read voltage, read pass voltage, verification voltage, erase voltage, common source line voltage, well bias voltage, and the like. The voltage generator 110 may generate word line voltages necessary for programing new data in memory cells arranged in the memory cell array 160, reading the data stored in the memory cells, or erasing the data stored in the memory cells. Hereinafter, the voltage generator 110 will be more specifically described with reference to FIG. 3.

A plurality of memory cells of the memory cell array 160 may be disposed in a p-type well region (e.g., pocket p-well) in a substrate.

The clock generator 111 may generate one or more pumping clock signals (CLK_P) based on a system clock signal (CLK) (or, external clock signal) received from outside of the nonvolatile memory device 100 and a determination signal (DET) received from the voltage generator 110 during a program operation or an erase operation. The system clock (CLK) input to the clock generator 111 may be used to provide timing to other circuits of the nonvolatile memory device 100 and may be generated based on a clock signal input to the nonvolatile memory device 100. As an example, the clock generator 111 may generate the pumping clock signal (CLK_P) when a pumping voltage signal (or pumping voltage) (Vp) of the voltage generator 110 is lower than a reference pumping voltage (Vpump_REF). In this case, a level of the pumping voltage (Vp) and a level of the reference pumping voltage (Vpump_REF) may be a positive value. As another example, the clock generator 111 may generate the pumping clock signal (CLK_P) when a negative pumping voltage (−Vp) of the voltage generator 110 is higher than a negative reference pumping voltage (−Vpump_REF). In this case, a level of the negative pumping voltage (−Vp) and a level of the negative reference pumping voltage (−Vpump_REF) may be a negative value. The pumping clock signal (CLK_P) may include a plurality of pulses, and may be generated by connecting the input providing the system clock signal (CLK) to the output providing the pumping clock signal (CLK_P) to selectively pass the system clock signal (CLK) to this output in response to the determination signal DET. A specific example thereof will be given later.

Figure 3:
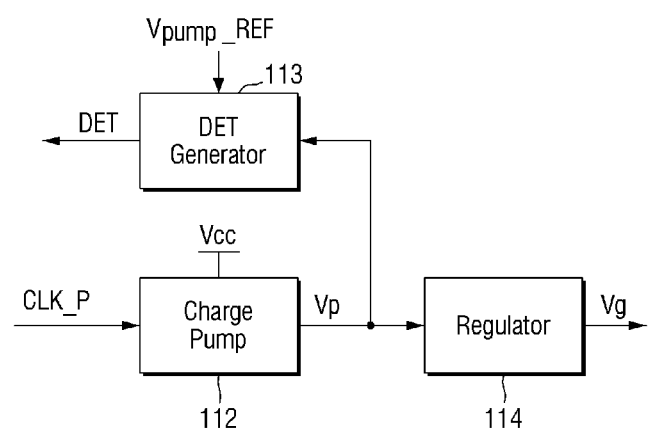
FIG. 3 is a block diagram for explaining a voltage generator of FIG. 2 according to some embodiments.

FIG. 3 is a block diagram for explaining the voltage generator of FIG. 2 according to some embodiments.

Referring to FIG. 3, the voltage generator 110 may include a charge pump 112, a determination signal generator 113, and a regulator 114.

The charge pump 112 may include a plurality of charge pump circuits and control circuits. Each of the plurality of charge pump circuits may be enabled or disabled by the control circuit, and may perform the charge pumping operation, by utilizing the pumping clock signal (CLK_P) provided from the clock generator 111 and the power supply voltage (Vcc). For example, the charge pump 112 may generate a plurality of pumping voltage signals (Vp) by using one or more pumping clock signals (CLK_P).

The regulator 114 regulates the pumping voltage signal (Vp), which is output from the charge pump 112, to generate the operating voltage (Vg), and may supply the generated operating voltage (Vg) to a memory cell array (160 of FIG. 2) through an address decoder (130 of FIG. 2).

The determination signal generator 113 may generate the determination signal (DET) by comparing the pumping voltage signal (Vp), which is output from the charge pump 112, with the reference pumping voltage (Vpump_REF). The generated determination signal (DET) is provided to the clock generator 111 and may be used to generate the pumping clock signal (CLK_P). For example, the pumping voltage signal (Vp) may include a plurality of pumping voltage signals (Vp) and the reference pumping voltage (Vpump_REF) may include a plurality of reference pumping voltages (Vpump_REF).

Hereinafter, the process of generating the pumping clock signal (CLK_P) will be more specifically described, referring to FIG. 4 together.

Figure 4:
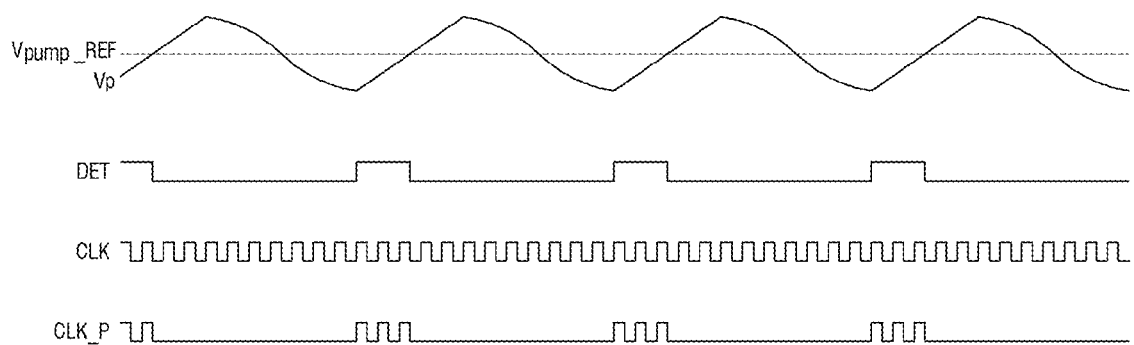
FIG. 4 is a diagram for explaining a pumping clock signal of FIGS. 2 and 3 according to some embodiments.

FIG. 4 is a diagram for explaining the pumping clock signal of FIGS. 2 and 3 according to some embodiments.

Referring to FIGS. 3 and 4, the determination signal generator 113 may compare the pumping voltage signal (Vp), which is output from the charge pump 112, with the reference pumping voltage (Vpump_REF) to generate the determination signal (DET). For example, as illustrated in FIG. 4, the determination signal (DET) may maintain a high level (i.e., logical high level) in a section in which the pumping voltage signal (Vp) is lower than the reference pumping voltage (Vpump_REF) among the sections in which the pumping voltage signal (Vp) rises and/or falls, and may maintain a low level (i.e., logical low level) in other sections.

The determination signal (DET) generated by the determination signal generator 113 is provided to the clock generator 111, and the clock generator 111 may compute (e.g., AND computation) the system clock signal (CLK) and the determination signal (DET) to generate the pumping clock signal (CLK_P). As a result, as illustrated in FIG. 4, in the pumping clock signal (CLK_P), a signal in the pulse form exists in a section (that is, a section in which the operating voltage (Vg) is applied to the memory cell array (160 of FIG. 2)) in which the charge pump 112 generates the pumping voltage signal (Vp) for generating the operating voltage (Vg).

While an example configuration of the voltage generator 110 which generates the operating voltage (Vg) necessary for the operation of the nonvolatile memory device 100 and generates the pumping clock signal (CLK_P) using the system clock signal (CLK) has been described above using FIGS. 3 and 4, the embodiments are not limited thereto. The configuration of the voltage generator 110 may be differently modified and provided as necessary.

Referring again to FIG. 2, the pass-fail determination circuit 120 may receive the pumping clock signal (CLK_P) from the voltage generator 110 and monitor the pumping clock signal (CLK_P) to determine the existence of defects of the wirings included in the memory cell array 160. Specifically, the pass-fail determination circuit 120 receives the pumping clock signal (CLK_P) from the clock generator 111, compares a number of pulses of the received pumping clock signal (CLK_P) with a reference value (REF_C) in a period of time (e.g., while applying a program voltage to a corresponding word line, while applying an erase voltage to a well region in the substrate, or while applying a pass voltage to a word line adjacent to a word line performing a program operation), and may determine the defects of the wirings in the memory cell array 160 to which the operating voltage (Vg) is being applied. More specifically, the pass-fail determination circuit 120 compares the number of pulses included in the pumping clock signal (CLK_P) with the reference value (REF_C) to determine the defects of the word lines (WL1 to WL8 of FIG. 7) in the memory cell array 160 to which the operating voltage (Vg) is being applied. For example, the reference value (REF_C) may be stored in a register included in the nonvolatile memory device 100 or the memory controller 200.

If it is determined that there is a defect in the specific word lines (WL1 to WL8 of FIG. 7), the pass-fail determination circuit 120 may provide the signal meaning that there is a defect in the specific word lines (WL1 to WL8 of FIG. 7) or the signal meaning that it is necessary to process the memory blocks (BLK1 to BLKz) including the defective word lines (WL1 to WL8 of FIG. 7) as a bad product to the control logic 150 in the form of the pass-fail result signal (P/F).

Hereinafter, the pass-fail determination circuit 120 will be described in more detail with reference to FIG. 5.

Figure 5:
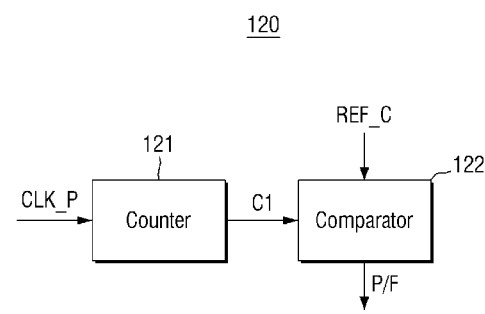
FIG. 5 is a block diagram for explaining a pass-fail determination circuit of FIG. 2 according to some embodiments.

FIG. 5 is a block diagram for explaining the pass-fail determination circuit of FIG. 2 according to some embodiments.

Referring to FIG. 5, the pass-fail determination circuit 120 may include a counter 121 and a comparator 122.

The counter 121 receives the pumping clock signal (CLK_P), counts a number of pulses (C1) included in the pumping clock signal (CLK_P), and may output the result thereof. Specifically, the counter 121 receives the pumping clock signal (CLK_P), counts the number of pulses (C1) included in each cycle of the pumping clock signal (CLK_P), and may outputs the result thereof.

The comparator 122 may compare the reference value (REF_C) and the number of pulses (C1) included in the pumping clock signal (CLK_P) provided from the counter 121, thereby generating and outputting the a pass-fail result signal (P/F). In some embodiments, when the number of pulses (C1) included in the pumping clock signal (CLK_P) is larger than or equal to the reference value (REF_C), the comparator 122 may generate and output a signal meaning that one or more specific word lines (WL1 to WL8 of FIG. 7) are defective, or a signal meaning that one or more memory blocks (BLK1 to BLKz) including the defective word lines (WL1 to WL8 of FIG. 7) as a defective block, in the form of the pass-fail result signal (P/F). More specific description thereof will be given later.

An exemplary configuration of the pass-fail determination circuit 120 that monitors the pumping clock signal (CLK_P) to determine the defect of the wirings included in the memory cell array 160 has been described with reference to FIG. 5. However, the embodiment is not limited thereto. The configuration of the pass-fail determination circuit 120 may be differently modified and provided as necessary.

Referring again to FIG. 2, the address decoder 130 may select one of the plurality of memory blocks (BLK1 to BLKz) in response to the address (ADDR). Here, the address (ADDR) may include a plurality of addresses. Also, the address decoder 130 may be connected to the memory cell array 160 through a plurality of word lines (WL), at least one string selection line (SSL), and at least one ground selection line (GSL). The address decoder 130 may select one of the word lines (WL), the string selection line (SSL), and the ground selection line (GSL), using the decoded row address. Also, the address decoder 130 may decode a column address among the address (ADDR). Here, the decoded column address may be transmitted to the input/output circuit 140. In some embodiments, the address decoder 130 may include a row decoder, a column decoder, an address buffer, and the like.

The input/output circuit 140 may be connected to the memory cell array 160 via the bit line (BL). The input/output circuit 140 may be provided to receive the decoded column address from the address decoder 130. The input/output circuit 140 may select the bit line (BL), using the decoded column address.

The input/output circuit 140 may include a plurality of page buffers which stores data to be programmed when the nonvolatile memory device 100 executes a program operation, or stores a plurality of read data when executing a read operation. Here, each of the plurality of page buffers may include a plurality of latches. During a program operation, data stored in a plurality of page buffers may be programmed to a page (e.g., a group of memory cells) corresponding to a memory block selected via a bit line (BL). The data read from the page corresponding to the selected memory block at the time of the read operation may be stored in the page buffer via the bit line (BL). Furthermore, the input/output circuit 140 may read data from a first region of the memory cell array 160 and may store the read data in a second region of the memory cell array 160. For example, the input/output circuit 140 may be provided to perform copy-back.

The control logic 150 may control the overall operations (program, read, erase, and the like) of the nonvolatile memory device 100. Specifically, the control logic 150 may control the voltage generator 110, the pass-fail determination circuit 120, the address decoder 130, and the input/output circuit 140 during operation of the nonvolatile memory device 100. The control logic 150 may operate in response to an externally input control signal (CTRL) or a command (CMD).

The memory cell array 160 may be provided, for example, as a three-dimensional memory array structure. The three dimensional memory array may have a vertical directionality, and may include a plurality of vertical NAND strings in which at least one memory cell is located over another memory cell. At least one memory cell may include, for example, a charge trap layer. Each vertical NAND string may include at least one selection transistor located above the memory cells. The at least one selection transistor has the same structure as the memory cell and may be monolithically formed together with the memory cells. The term monolithic means that the layers of each level of the three dimensional array are deposited directly on the lower level layers of the three dimensional array.

A three-dimensional memory array includes a plurality of levels, and word lines or bit lines shared between the levels may be disposed. The nonvolatile memory device 100 may be a flash memory device in which a charge storage layer is made up of a conductive floating gate, or a charge trap flash (CTF) memory device in which a charge storage layer is made up of an insulating film. Hereinafter, the description will be given on the assumption that the nonvolatile memory device 100 is a vertical type NAND flash memory device as an example.

The memory cell array 160 may include a plurality of memory blocks (BLK1 to BLKz). Each of the memory blocks (BLK1 to BLKz) is connected to the address decoder 130 through the plurality of word lines (WL), at least one string selection line (SSL), and at least one ground selection line (GSL), and may be connected to the input/output circuit 140 via a plurality of bit lines (BL). In some embodiments, the plurality of word lines (WL) may have a stacked plate-like structure.

Each of the plurality of memory blocks (BLK1 to BLKz) may have a plurality of strings of a three-dimensional structure which is arranged on a substrate along a first direction and a second direction different form the first direction and is arranged in a third direction perpendicular to a plane formed by the first and second directions. Here, each of the plurality of strings may include at least one string selection transistor serially connected between the bit line and a common source line (CSL), a plurality of memory cells, and at least one ground selection transistor. Here, each of the plurality of memory cells may store at least one bit. In some embodiments, at least one dummy cell may be included between at least one string selection transistor and the plurality of memory cells. In some embodiments, at least one dummy cell may be included between the plurality of memory cells and the at least one ground selection transistor. Hereinafter, the memory blocks (BLK1 to BLKz) of the memory cell array 160 will be described in more detail with reference to FIGS. 6 and 7.

Figure 6:
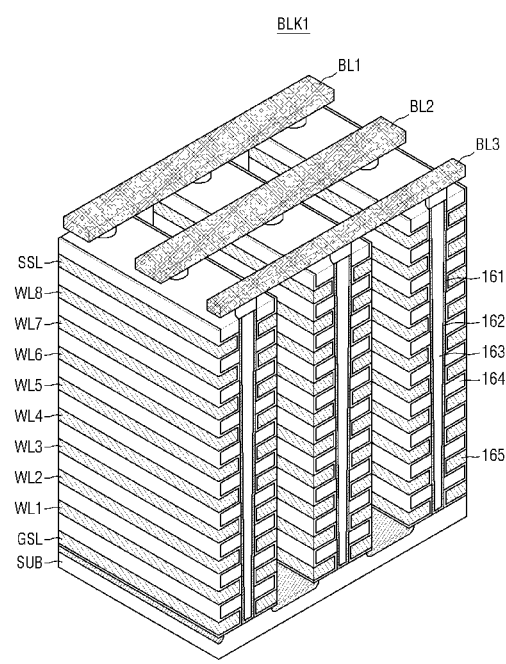
FIGS. 6 and 7 are diagrams for explaining the memory cell array of FIG. 2.
Figure 7:
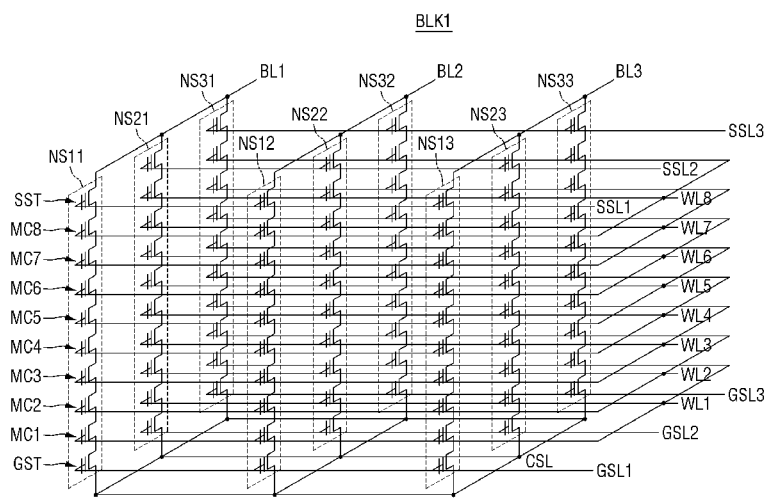

FIGS. 6 and 7 are diagrams for explaining the memory cell array of FIG. 2.

Referring to FIG. 6, the memory block (BLK1) may be formed in a direction perpendicular to the substrate (SUB). For example, an n+ doping region containing impurities may be formed in the substrate (SUB).

A gate electrode 165 and an insulating film 164 may be alternately stacked on the substrate (SUB). A data storage film 161 may be formed between the gate electrode 165 and the insulating film 164.

A pillar may penetrate the gate electrode 165 and the insulating film 164 in the vertical direction. The pillar may be formed in a V-shape as illustrated. The pillar may be connected to the substrate (SUB) through the gate electrode 165 and the insulating film 164. The inside of the pillar is a charging dielectric pattern 163 and may be made of an insulating material such as silicon oxide. The outside of the pillar is a vertical active pattern 162 and may be made of a channel semiconductor.

The gate electrode 165 of the memory blocks (BLK1) may be connected to the ground select line (GSL), the plurality of word lines (WL1 to WL8) and the string selection line (SSL). The vertical active pattern 162 formed outside the pillar of the memory block (BLK1) may be connected to the plurality of bit lines (BL1 to BL3). Although FIG. 6 illustrates a configuration in which one memory block (BLK1) has two selection lines (GSL, and SSL), eight word lines (WL1 to WL8), and three bit lines (BL1 to BL3), the embodiment is not limited thereto. If necessary, the number of wirings may be differently modified and provided.

FIG. 7 is an exemplary equivalent circuit diagram of the memory block (BLK1). Referring to FIG. 7, cell strings (NS11 to NS33) may be disposed between the bit lines (BL1 to BL3) and the common source line (CSL). Each of the cell strings (e.g., NS11) may include a ground selection transistor (GST), a plurality of memory cells (MC1 to MC8), and a string selection transistor (SST).

The string selection transistor (SST) may be connected to the string selection line (SSL). The string selection line (SSL) may be divided into the first to third string selection lines (SSL1 to SSL3). The ground selection transistor (GST) may be connected to first to third ground selection lines (GSL1 to GSL3). In some embodiments, the first to third ground select lines (GSL1 to GSL3) may be connected to each other. The string selection transistor (SST) may be connected to the bit line (BL), and the ground selection transistor (GST) may be connected to the common source line (CSL).

The plurality of memory cells (MC1 to MC8) may be connected to the corresponding word lines (WL1 to WL8), respectively. A group of memory cells connected to one word line and programmed at the same time may be called a page. The memory block (BLK1) may include a plurality of pages as illustrated. In addition, a plurality of pages may be connected to one word line. Referring to FIG. 7, word lines (e.g., WL4) of the same height from the common source line (CSL) may be connected in common to the three pages.

These pages may be a unit of data program and read, and the memory block (BLK1) may be a unit of data erase. That is, when the nonvolatile memory device executes a program or a read operation, data in the unit of page may be programmed or read, and when the nonvolatile memory device executes the erasing operation, data may be erased in the unit of memory block. For example, data stored in all the memory cells (MC1 to MC8) included in one memory block may be erased at once.

Each of the memory cells (MC1 to MC8) may store data of one bit or data of two or more bits. A memory cell capable of storing data of one bit in one memory cell (MC1 to MC8) may be referred to as a single level cell (SLC) or a single bit cell. A memory cell capable of storing data of two or more bits in one memory cell may be referred to as a multi-level cell (MLC) or a multi-bit cell. In the case of 2 bit MLC, two page data may be stored in one physical page. Therefore, six page data may be stored in the memory cell (MC4) connected to the word line (WL4).

Here, the word line defect detection operation of the nonvolatile memory device 100 will be specifically described below with reference to FIGS. 3, 8 and 9.

Figure 8:
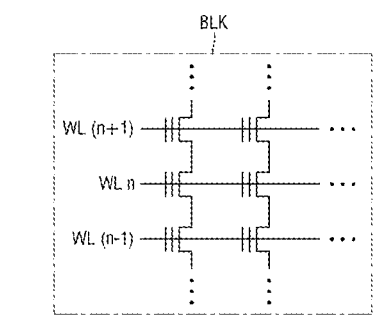
FIGS. 8 and 9 are diagrams for explaining a word line defect detection operation of the nonvolatile memory device according to some embodiments.
Figure 8:
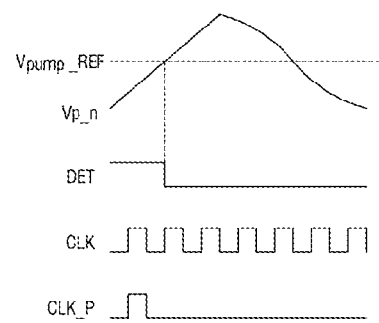
Figure 9:
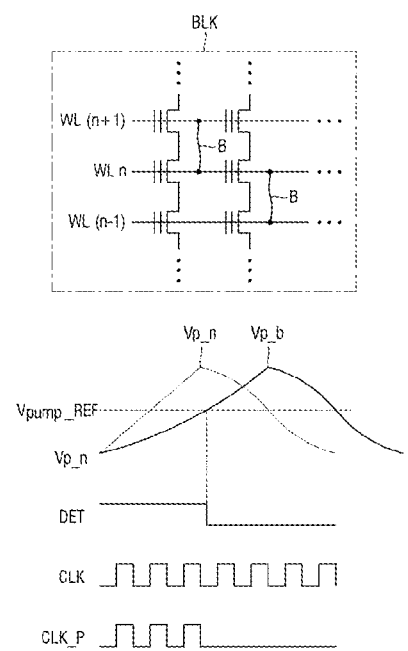

FIGS. 8 and 9 are diagrams for explaining the word line defect detection operation of the nonvolatile memory device according to some embodiments.

First, referring to FIGS. 2, 3 and 8, when there is no defect in the word lines (WL(n−1), WLn, and WL(n+1)) included in the memory block (BLK), the charge pump 112 outputs a normal pumping voltage signal (Vp_n), and the determination signal generator 113 compares the normal pumping voltage signal (Vp_n) output from the charge pump 112 with the reference pumping voltage (Vpump_REF) to generate a determination signal (DET). The clock generator 111 may generate the pumping clock signal (CLK_P) from the system clock signal (CLK), using the determination signal (DET) which is output from the determination signal generator 113. Since this has been described above with reference to FIG. 4, a more specific description will not be provided.

Referring to FIGS. 2, 3 and 9, if a bridge (B) defect exists in the word lines (WL(n−1), WLn, and WL(n+1)) included in the memory block (BLK) as illustrated, the charge pump 112 may output the bridge pumping voltage signal (Vp_b). The bridge pumping voltage signals (Vp_b) may take time to reach a target voltage as compared with the normal pumping voltage signal (Vp_n), but this may be due to an occurrence of current leakage because the word lines (WL(n−1), WLn, and WL(n+1)) are mutually connected to each other by the bridge (B). For example, due to the bridge (B) generated between at least one adjacent word lines (WL(n−1), WLn, and WL(n+1)), the charge pump 112 may take more time to generate the target level of voltage.

When such a phenomenon occurs, it may take more time for the charge pump 112 to reach the reference pumping voltage (Vpump_REF). As a result, the period of the determination signal (DET) may become longer than a normal case (FIG. 8) where there is no defect between the adjacent word lines (WL(n−1), WLn, and WL(n+1)). Therefore, the number of pulses included in the pumping clock signal (CLK_P) becomes larger than a normal case (FIG. 8) where there is no defect between the adjacent word lines (WL(n−1), WLn, and WL(n+1)). For example, in the examples of FIGS. 8 and 9, the number of pulses included in the pumping clock signal (CLK_P) increased from one to three.

The nonvolatile memory device 100 according to the present embodiment may detect the defects of the word lines (WL(n−1), WLn, and WL(n+1)) in the memory block (BLK), using such a principle. For example, when the reference value (REF_C of FIG. 5) is preset as 2, if the number of pulses included in the pumping clock signal (CLK_P) is one as illustrated in FIG. 8, the nonvolatile memory device 100 may determine the word lines (WL(n−1), WLn, and WL(n+1)) in the memory block (BLK) as normality. Further, if the number of pulses included in the pumping clock signal (CLK_P) is three as illustrated in FIG. 9, the nonvolatile memory device 100 may determine that there are defects in the word lines (WL(n−1), WLn, and WL(n+1)) in the memory block (BLK). For example, by comparing the number of pulses (C1 of FIG. 5) included in the pumping clock signal (CLK_P) with the reference value (REF_C of FIG. 5), it is possible to detect the presence or absence of defects in the word lines (WL(n−1), WLn, and WL(n+1)) in the memory block (BLK).

Although the normal pumping voltage signal (Vp_n) and the bridge pumping voltage signal (Vp_b) are illustrated to be clearly distinguished in FIG. 9 for convenience of understanding, the actual output of the charge pump 112 may be provided differently from the illustrated one. For example, the output of the charge pump 112 may be modified and provided to any other configuration in which the number of pulses included in the pumping clock signal (CLK_P) increases.

Hereinafter, in a user mode in which the nonvolatile memory device 100 programs data through communication with the host (HOST), reads data, and erases data, the operation for detecting presence or absence of the defects of the word lines (WL(n−1), WLn, and WL(n+1)) in the memory block (BLK) will be described.

First, the operation of detecting the presence or absence of a defect in the word lines (WL(n−1), WLn, and WL(n+1)) in the memory block (BLK) during execution of erasing operation will be described referring to FIGS. 10 to 12. Next, the operation of detecting the presence or absence of detects in the word lines (WL(n−1), WLn, and WL(n+1)) in the memory block (BLK) during execution of the program operation will be described referring to FIGS. 13 to 15.

Figure 10:
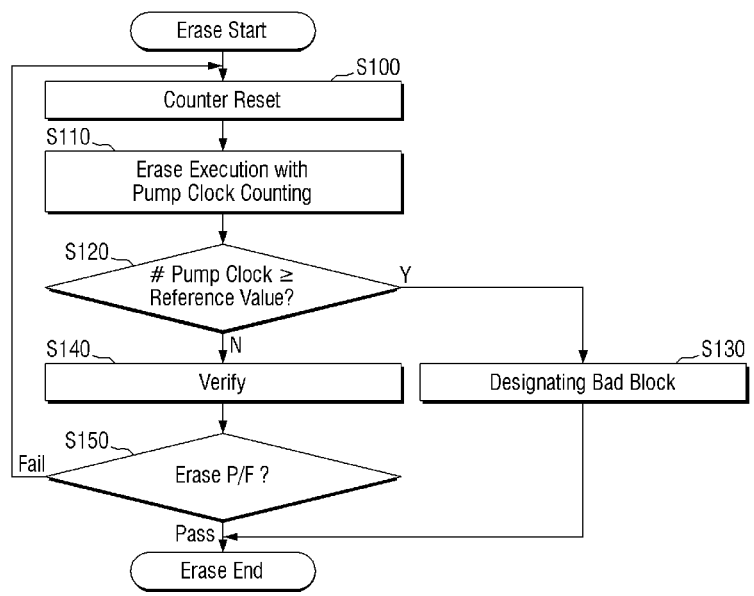
FIG. 10 is a flowchart illustrating an operation of the nonvolatile memory device according to some embodiments.

FIG. 10 is a flowchart illustrating an operation of the nonvolatile memory device 100 according to some embodiments. FIGS. 11 and 12 are diagrams for specifically explaining the operation of the nonvolatile memory device 100 illustrated in FIG. 10 according to some embodiments.

Referring to FIG. 10, the counter is reset (S100). For example, referring to FIG. 5, the pass-fail determination circuit 120 may reset the counter 121 to perform a new defect detection operation.

Next, referring to FIG. 10, an erasing operation is executed, while counting the number of pulses included in the pumping clock signal (CLK_P) (S110). For example, referring to FIGS. 2 and 6, in order to erase the memory block (e.g., BLK1) included in the memory cell array 160, the voltage generator 110 generates a first erase voltage (Vpwell) which is provided to the p-well region, and a second erase voltage smaller than the first erase voltage provided to the word lines (e.g., WL8 to WL1) in the memory block (BLK1). At this time, the pass-fail determination circuit 120 may count the number of pulses included in the pumping clock signal (CLK_P) while the first and second erase voltages are applied to the p-well region and the word lines (WL1 to WL8) in the memory block (BLK1), respectively.

Next, referring to FIG. 10, it is determined whether the number of pulses included in the pumping clock signal (CLK_P) is larger than or equal to the reference value (REF_C) (S120).

As a result, when the number of pulses included in the pumping clock signal (CLK_P) is larger than or equal to the reference value (REF_C), since there is a high possibility that a defect exists in at least one of the word lines (e.g., WL2), after the memory block (BLK1) including the word line (WL2) is designated as a bad block (S130), the erasing operation is terminated.

Conversely, when the number of pulses included in the pumping clock signal (CLK_P) is smaller than the reference value (REF_C), since it is determined that there is no defect in the word lines (WL8 to WL1), it is verified whether the erasing operation for the word lines (WL8 to WL1) of the memory block (BLK1) is completed (S140). When the erasing operation for the word lines (WL8 to WL1) has been failed as a result of verification (S150—Fail), the above-described erasing operation is repeated again with applying an erase voltage greater than a previous applied first erase voltage to the p-well region. When a particular erase voltage is applied to the p-well region and the erasing operation for the word lines (WL8 to WL1) has been still failed as a result of the verification (S150—Fail), the aforementioned erasing operation may be not repeated again and the erasing operation may be stopped. When the erasing operation for the word lines (WL8 to WL1) in the memory block (BLK1) is passed (S150—Pass), the erasing operation is terminated (S150—Pass).

For example, referring to FIG. 2, the pass-fail determination circuit 120 may determine whether the number of pulses included in the pumping clock signal (CLK_P) is larger than or equal to the reference value (REF_C).

When the number of pulses included in the pumping clock signal (CLK_P) is larger than or equal to the reference value (REF_C), the pass-fail determination circuit 120 may provide to the control logic 150 in the form of a pass-fail result signal (P/F) notification that it is necessary to designate a memory block (BLK1) including the defective word line (WL2), to which the second erase voltage is applied, as a bad block.

Conversely, when the number of pulses included in the pumping clock signal (CLK_P) is smaller than the reference value (REF_C), the control logic 150 verifies whether the erasing operation of the memory block (BLK1) has been completed, and may repeat the erasing operation until the erasing operation is completed at the particular erase voltage.

Figure 11:
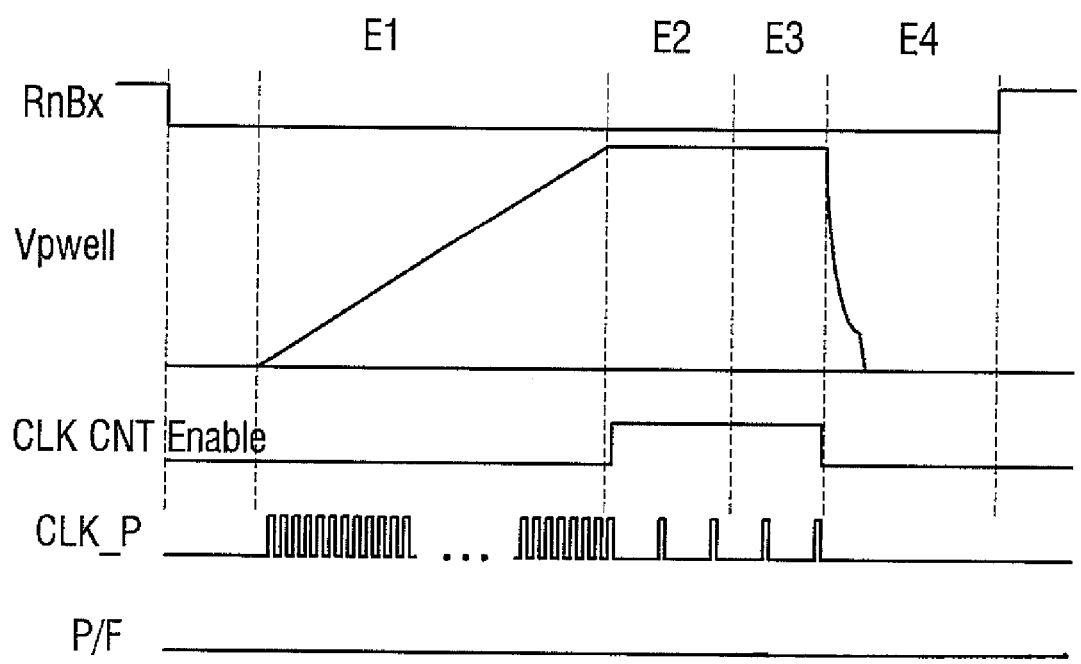
FIGS. 11 and 12 are diagrams for specifically explaining the operation of the nonvolatile memory device illustrated in FIG. 10 according to some embodiments.
Figure 12:
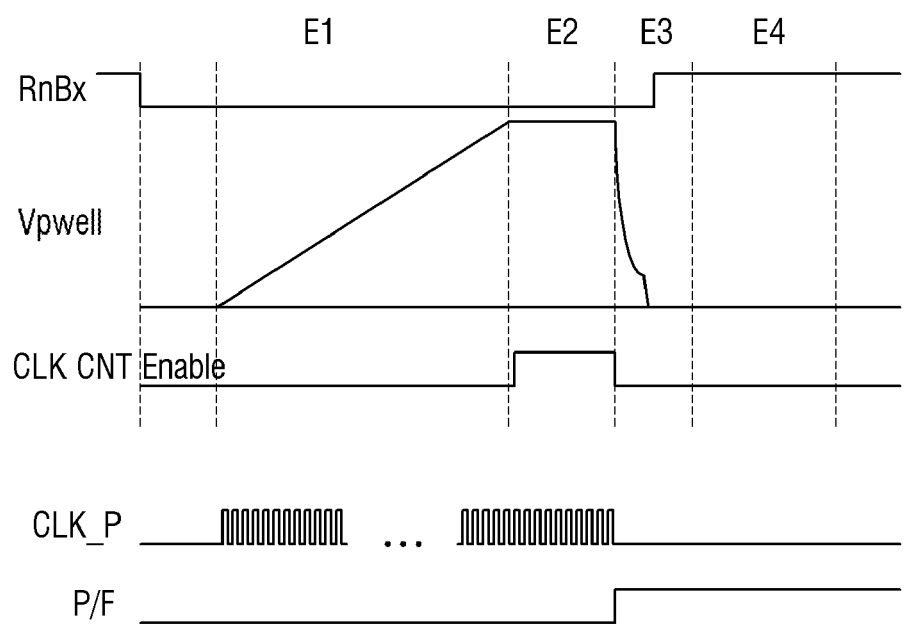

Hereinafter, with reference to FIG. 11 and FIG. 12, comparison will be made between a case where no defect exists in the word lines and a case where a defect exists.

First, FIG. 11 is a timing chart in the case where no defect exists in the word lines (WL8 to WL1) in the memory block (BLK1).

Referring to FIG. 11, the user mode signal (RnBx) is enabled in the first section (E1), and a first erase voltage may be applied to the substrate (e.g., p-well region of the substrate) for erasing data of the memory cells in the memory block (BLK1). At this time, a second erase voltage smaller than the first erase voltage may be applied to the word lines (WL8 to WL1) in the memory block (BLK1).

In the second section (E2), when the second erase voltage reaches at a target voltage the clock count signal (CLK CNT) is enabled, and counting of the pumping clock signal (CLK_P) may be started. Since there is no defect in the word lines (WL8 to WL1), the erasing operation may be continuously executed up to the third section (E3). In some embodiments, these erasing operations may be performed by repeating application of a predetermined erase voltage to the memory cell array (e.g., to the p-well region and the word lines) a plurality of times.

When the erasing operation of the memory block (BLK1) is completed, the erasing operation may be completed by disabling the user mode signal (RnBx) after the application of the erase voltage is stopped in the fourth section (E4). In the fourth section (E4), the nonvolatile memory device 100 may be verified whether the erasing operation has been completed may be executed. While such an operation is performed, since no defect is found in the word lines, the pass-fail result signal (P/F) may maintain the disabled state.

Next, FIG. 12 is a timing chart when a defect exists in at least one of the word lines (e.g., WL2).

Referring to FIG. 12, the user mode signal (RnBx) is enabled in the first section (E1), and a first erase voltage (Vpwell) may be applied to the p-well region for erasing operation of the memory block (BLK1). At this time, the second erase voltage smaller than the first erase voltage may be applied to the word lines (WL8 to WL1) in the memory block (BLK1).

In the second section (E2), the clock count signal (CLK CNT) is enabled and counting of the pumping clock signal (CLK_P) may be started. In this case, since the number of pulses of the pumping clock signal (CLK_P) is larger than or equal to the reference value (REF_C), it may be determined that a defect exists in the word line (WL2).

Therefore, unlike the case described above referring to FIG. 11, the erasing operation may be stopped directly in the third section (E3). For example, the application of the first erase voltage (Vpwell) to the p-well region is stopped, and the application of the second erase voltage may also be stopped to the word lines (WL8 to WL1). Further, the pass-fail result signal (P/F) may be enabled and the memory block (BLK1) may be designated as a bad block. Then, since the user mode signal (RnBx) is immediately disabled, the erasing operation of the memory block (BLK1) may be stopped. As described above, when a word line defect is found during the execution of the erasing operation, by immediately stopping the application of the erase voltage, unnecessary power consumption can be prevented.

Figure 13:
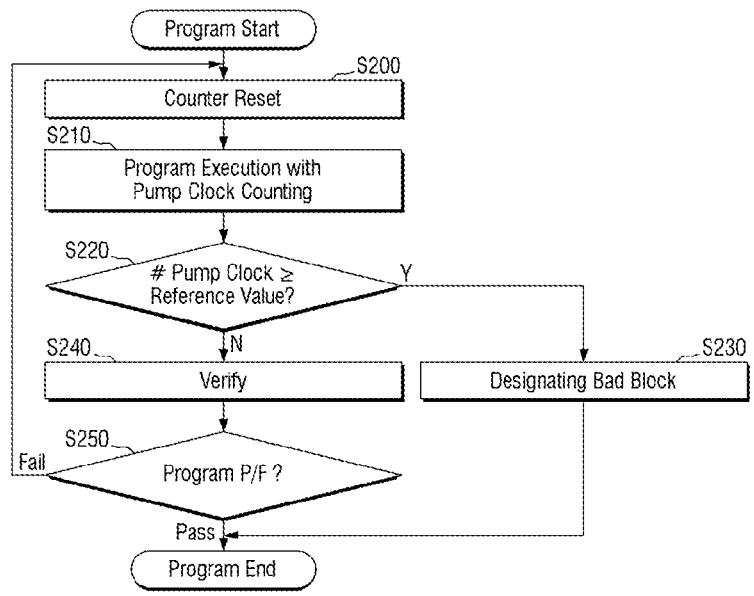
FIG. 13 is a flowchart for explaining an operation of the nonvolatile memory device according to some embodiments.
Figure 14:
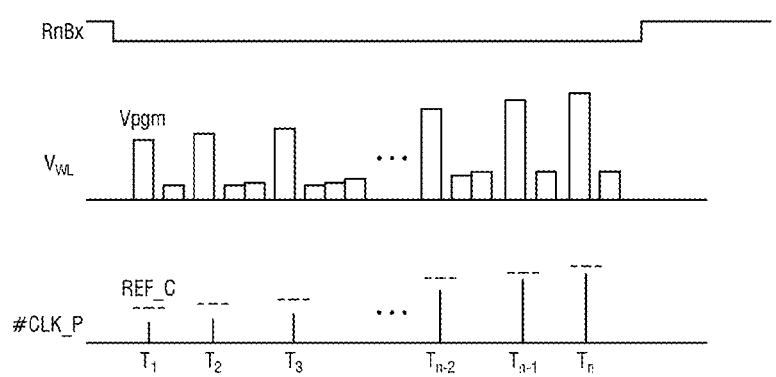
FIGS. 14 and 15 are diagrams for specifically explaining the operation of the nonvolatile memory device illustrated in FIG. 13 according to some embodiments.
Figure 15:
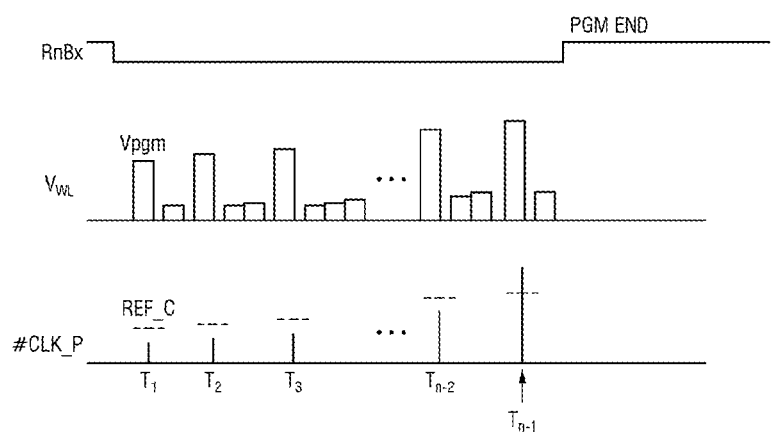

FIG. 13 is a flowchart for explaining an operation of the nonvolatile memory device according to some embodiments. FIGS. 14 and 15 are diagrams for specifically explaining the operation of the nonvolatile memory device illustrated in FIG. 13 according to some embodiments.

Referring to FIG. 13, the counter is reset (S200). For example, referring to FIG. 5, the pass-fail determination circuit 120 may reset the counter 121 to perform a new defect detection operation.

Next, referring to FIG. 13, a program operation is executed, while counting the number of pulses included in the pumping clock signal (CLK_P) (S210). For example, referring to FIGS. 2 and 7, the voltage generator 110 may generate a program voltage to be provided to a word line (e.g., WL2) of the word lines (WL1 to WL8) so as to program memory cells (MC2) connected to the word line (WL2) or a page of memory cells in eluding memory cells (MC2). At this time, the pass-fail determination circuit 120 may count a number of pulses included in the pumping clock signal (CLK_P), while a program voltage is applied to the word line (WL2) of the word lines (WL1 to WL8).

Next, referring to FIG. 13, it is determined whether the number of pulses included in the pumping clock signal (CLK_P) is larger than or equal to the reference value (REF_C) (S220).

As a result, when the number of pulses included in the pumping clock signal (CLK_P) is larger than or equal to the reference value (REF_C) (S220-Y), since there is a high possibility that a defect exists in the word line (WL2), after the memory block including the word line (WL2) is designated as a bad block (S230), the program operation is terminated.

Conversely, when the number of pulses included in the pumping clock signal (CLK_P) is smaller than the reference value (REF_C) (S220-N), since it is determined that there is no defect in the word line (WL2), it is verified whether the program operation of the memory cells of the word line (WL2) or the page has been completed (S240). This may include performing a read verification of the page of memory cells of word line WL2 to determine that those memory cells to be programmed in this programming step have had their threshold voltages sufficiently increased. When the program operation for the word line (WL2) has not been completed as a result of the verification (S250—Fail), the aforementioned program operation is repeated again with applying a program voltage greater than a previous applied program voltage to the word line (WL2). When a particular program voltage is applied to the word line (WL2) and the program operation for the word line (WL2) has not been completed as a result of the verification (S250—Fail), the aforementioned program operation is not repeated again and the program operation for the word line (WL2) may be stopped. When the program operation for the word line (WL2) is completed (S250—Pass), the program operation is terminated. Next, a program operation for remaining word lines (e.g., word lines except for WL2) may be executed.

For example, referring to FIG. 2, the pass-fail determination circuit 120 may determine whether the number of pulses included in the pumping clock signal (CLK_P) is larger than or equal to the reference value (REF_C).

When the number of pulses included in the pumping clock signal (CLK_P) is larger than or equal to the reference value (REF_C), the pass-fail determination circuit 120 (P/F) may provide to the control logic 150 the notification that it is necessary to designate the memory block (BLK1) including the defective word line (WL2) to which the program voltage is applied, as a bad block, in the form of pass-fail result signal (P/F).

Conversely, when the number of pulses included in the pumping clock signal (CLK_P) is smaller than the reference value (REF_C), the control logic 150 may verify whether the program operation of the word line (WL2) or a page has been completed, and may repeat the program operation until the program operation for the word line (WL2) is completed.

Hereinafter, with reference to FIGS. 14 and 15, description will be given by comparing the case where no defect exists in the word line and the case where a defect exists.

First, FIG. 14 is a timing chart in the case where no defect exists in the word line.

Referring to FIG. 14, after the user mode signal (RnBx) is enabled, a predetermined program voltage (Vpgm) may be applied to the word line (e.g., WL2).

As illustrated, each program voltage (Vpgm) is applied to the word line (WL2) at each time point (T1, T2, . . . Tn−1, and Tn, n is a natural number), when the number of pulses included in the pumping clock signal (CLK_P) is smaller than the reference value (REF_C), since there is no defect in the word line (WL2), the program operation for the word line (WL2) may be executed continuously. In some embodiments, the program operation may be executed by repeating application of a predetermined program voltage (e.g., program voltage having gradually increasing level as illustrated) to the word line (WL2) of the memory cell array multiple times.

In some examples, the reference value (REF_C) may have different values in respective programming loops (e.g., as the programming voltage Vpgm is increased, the reference value (REF_C) may be increased).

In some examples, the reference value (REF_C) may have the same value in each of the programming loops.

When the program operation of the word line (WL2) or the page is completed, after the program voltage application is stopped, the program operation may be completed by disabling the user mode signal (RnBx).

Next, FIG. 15 is a timing chart in a case where a defect exists in the word line.

Referring to FIG. 15, after a user mode signal (RnBx) is enabled, a predetermined program voltage may be applied to the word line (WL2).

Since there is a defect in the word line (WL2), there may be a case where the number of pulses included in the pumping clock signal (CLK_P) is larger than or equal to the reference value (REF_C), while a particular program voltage is applied to the word line (WL2), for example, at a time point (Tn−1).

In this way, when there is a case where the number of pulses included in the pumping clock signal (CLK_P) is larger than or equal to the reference value (REF_C), the program operation may be immediately stopped. For example, application of a corresponding program voltage to the word line (WL2) may be immediately stopped. Further, by disabling the user mode signal (RnBx), the program operation may be stopped even though additional programming loops may have been applied to finish the programming of the page of memory cells. For example, when a word line defect is found during an execution of the program operation, by immediately stopping the application of the program voltage, unnecessary power consumption may be prevented.

Figure 16:
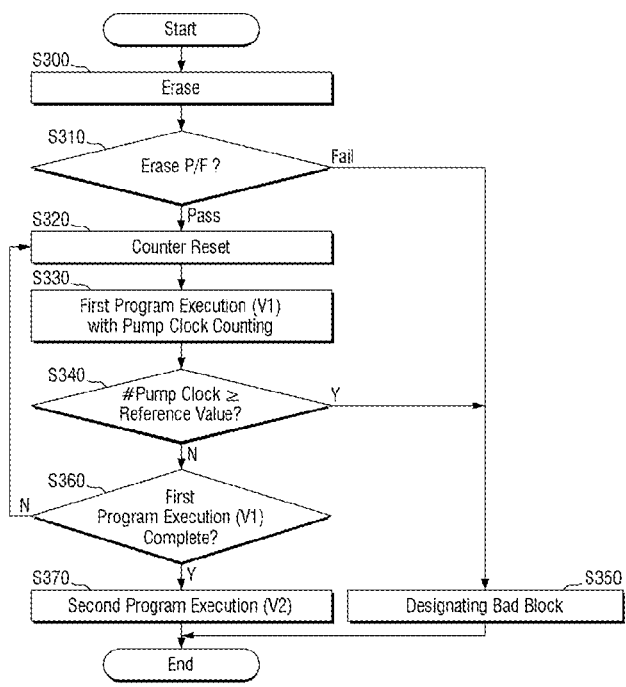
FIG. 16 is a flowchart for explaining an operation of the nonvolatile memory device according to some embodiments.
Figure 17:
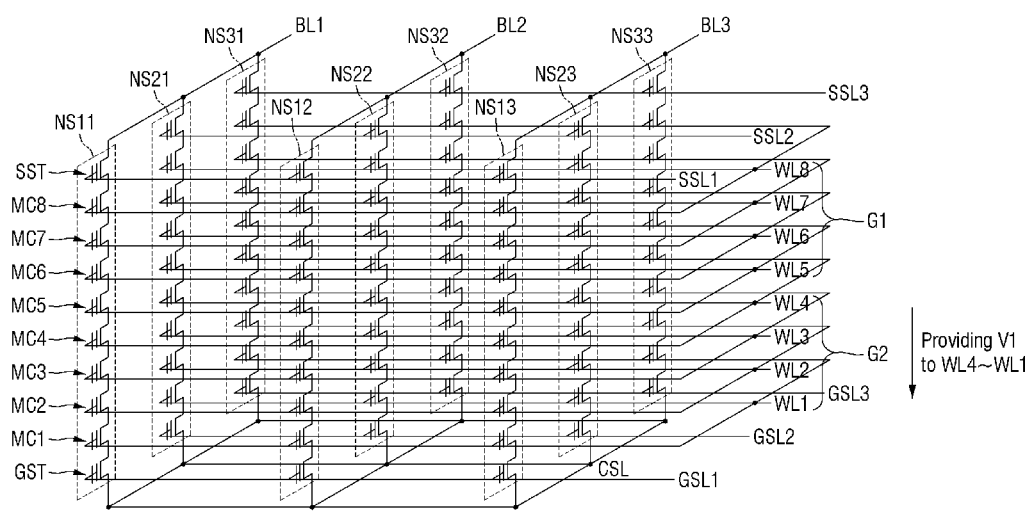
FIGS. 17 and 18 are diagrams for specifically explaining the operation of the nonvolatile memory device illustrated in FIG. 16 according to some embodiments.
Figure 18:
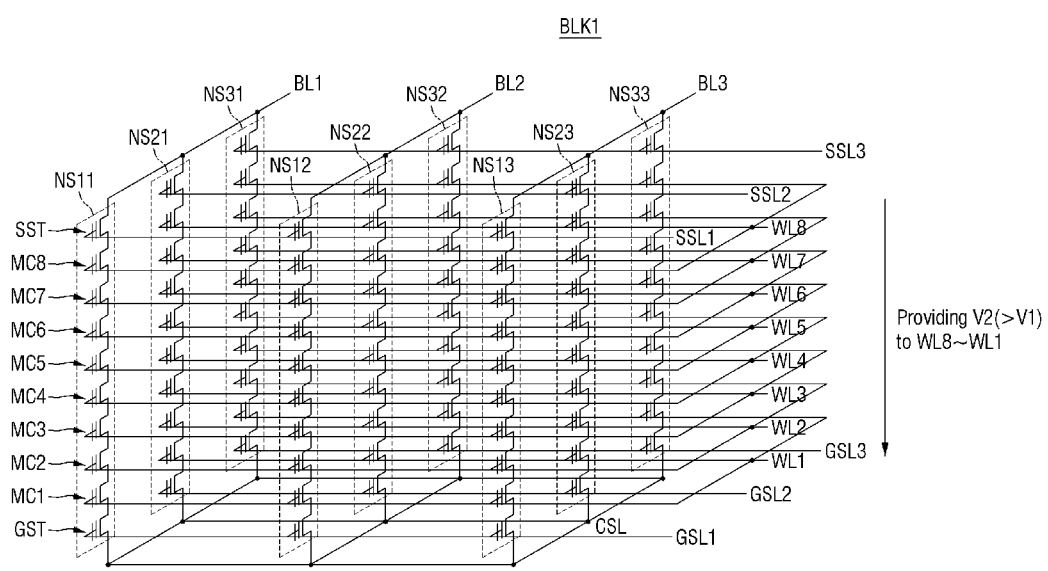

FIG. 16 is a flowchart for explaining an operation of the nonvolatile memory device according to some embodiments. FIGS. 17 and 18 are diagrams for specifically explaining the operation of the nonvolatile memory device illustrated in FIG. 16 according to some embodiments.

Referring to FIG. 16, an erasing operation of the memory block (BLK1) is executed (S300). The erasing operation may be the same as the erasing operation described above, for example, with reference to FIG. 10. However, the embodiment according to the technical idea of the present disclosure is not limited thereto, and the erasing operation of the memory block may be simply executed, while the process of determining the presence or absence of the word line defect is omitted in the erasing operation described referring to FIG. 10.

Thereafter, it is checked whether the erasing operation of the memory block (BLK1) is completed (S310).

If the erasing operation of the memory block (BLK1) has failed as a checking result (S310—Fail), the memory block (BLK1) is designated as a bad block (S350). Since the operation of designating the memory block (BLK1) as the bad block has been described specifically above, the repeated explanation will not be provided.

Conversely, when the erasing operation of the memory block (BLK1) is passed as a result of checking (S310—Pass), the counter reset is executed (S320). Since the counter reset operation has also been specifically described above, the repeated explanation will not be provided.

Thereafter, during an application of a first program voltage (V1) to the word line (e.g., WL4), a first program operation for the word line (WL4) is executed, while counting the number of pulses included in the pumping clock signal (CLK_P) (S330).

For example, referring to FIGS. 2 and 17, the voltage generator 110 may generate a first program voltage (V1) which will be provided to a lower word line group (G2), for example, word lines WL4 to WL1, included in the memory cell array 160. Further, the generated first program voltage (V1) may be sequentially provided to the word line (WL4) through the word line (WL1) included in the lower word line group (G2). At this time, the first program voltage (V1) may not be provided to a lower word line group (G1), for example, word lines WL8 to WL5 included in the memory cell array 160.

While the first program voltage (V1) is sequentially applied to the word line (WL4) through the word line (WL1), the pass-fail determination circuit 120 may count the number of pulses included in the pumping clock signal (CLK_P).

Next, referring to FIG. 16, it is determined whether the number of pulses included in the pumping clock signal (CLK_P) is larger than or equal to the reference value (REF_C) (S340).

As a result, when the number of pulses included in the pumping clock signal (CLK_P) is larger than or equal to the reference value (REF_C) (S340-Y), since a defect exists in at least one of the word lines (e.g., WL4) included in the lower word line group (G2), after the memory block (BLK1) including the word lines (WL4 to WL1) is designated as a bad block (S350), the program operation is terminated.

Conversely, when the number of pulses included in the pumping clock signal (CLK_P) is smaller than the reference value (REF_C) (S340-N), since there is no defect in the word line (e.g., WL4) included in the lower word line group (G2), the first program operation for the remaining word lines (WL3 to WL1) may be repeated until the first program operation for the word lines (WL4 to WL1) is completed (S360), and the memory cells (MC1 to MC8) of the word lines (WL8 to WL1) or pages are programmed at a second program voltage (V2) (S370). For example, a voltage level of the second program voltage (V2) may be the same as a voltage level of a program voltage (Vpgm) at the time point T1 in FIG. 14.

In an embodiment, a voltage level of the first program voltage (V1) may be either the same voltage level as or smaller than the second program voltage (V2).

In operation S370, a program operation for the word line (e.g., WL8) is executed at the second program voltage (V2) and may be repeated at a program voltage having gradually increasing level as illustrated in FIG. 14 until the program operation for the word line (WL8) is completed. When the program operation for the word line (WL8) is completed a program operation for the remaining word lines (WL7 to WL1) may be executed in the same way. The program operation for the word lines WL8 to WL5 may be the same as the program operation described above, for example, with reference to FIG. 13. In this case, the reference value (REF_C) used to monitor a number of pulses of the pumping clock signal (CLK_P) while applying the second program voltage (V2) to each of the word lines (e.g., WL8 to WL5) may be different from the reference value (REF_C) used to monitor a number of pulses of the pumping clock signal (CLK_P) while applying the first program voltage (V1) to each of the word lines (e.g., WL4 to WL1). In example embodiments, the program operation for the word lines WL8 to WL5 may be simply executed, while the process of determining the presence or absence of the word line defect is omitted in the program operation for the word lines WL8 to WL5 described referring to FIG. 13.

In example embodiments, after en erasing operation of the memory block including memory cells connected to the word line (e.g., WL4) is completed, data "1" may be stored in the memory cells connected to the word line (WL4). A threshold voltage of the memory cell connected to the word line (WL4) may not be shifted while applying the first program voltage (V1) to the word line (WL4). Thus, the word line defect detection circuit may monitor the number of pulses of the pumping clock signal while programming erase pattern to the memory cell connected to the word line (WL4). For example, during programming erase pattern, a state of data in a corresponding memory cell may not be changed from a state of erased data.

For example, referring to FIGS. 2 and 18, the voltage generator 110 may generate a second program voltage (V2) which will be provided to the word lines (WL8 to WL1) included in the memory cell array 160. Here, the second program voltage (V2) is a voltage for programming the data provided from the host (HOST) to the memory cells (MC1 to MC8), and may be greater than the first program voltage (V1) described above. By sequentially providing the generated second program voltage (V2) to the word line (WL8) through the word line (WL1), the memory cells (MC1 to MC8) of the word lines (WL8 to WL1) or the pages may be programmed.

In summary, in the operation of the nonvolatile memory device according to the present embodiment, before the second program voltage (V2) is applied to store data in the memory cells (MC1 to MC8), it is first checked whether or not a defect exists in the lower word line group (G2) at the first program voltage (V1) of a small level which does not affect the durability of the word lines (WL4 to WL1). The effect of the operation of the nonvolatile memory device will be described below with reference to FIG. 19.

Figure 19:
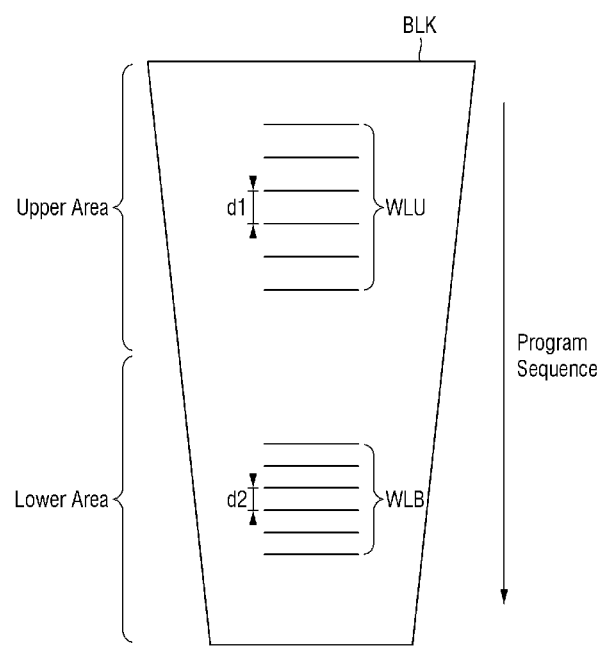
FIG. 19 is a diagram for explaining the effect of the operation of the nonvolatile memory device illustrated in FIG. 16 according to certain embodiments.

FIG. 19 is a diagram for explaining the effect of the operation of the nonvolatile memory device illustrated in FIG. 16 according to certain embodiments.

Referring to FIG. 19, in the vertical type NAND flash memory device, the memory block (BLK) may have a shape as illustrated in which the width of the lower portion is narrow and the width of the upper portion is wide. According to such a shape, the interval (d2) between two adjacent word lines of the lower word lines (WLB) disposed in the lower part may be smaller than the interval (d1) between two adjacent word lines of the upper word lines (WLU) disposed in the upper part.

In this way, when the interval (d2) is narrow, a bridge defect may relatively frequently occur in the lower word lines (WLB) disposed in the lower part.

For example, in order to improve the spreading characteristics of the program data, a method (program sequence) of executing a program in order from the upper word lines (WLU) disposed in the upper part of the memory block (BLK) to the word lines (WLB) disposed in the lower part may be used.

In this way, when executing the program in order from the upper word lines (WLU) to the lower word lines (WLB) disposed in the lower part, and the program operation and the word line defect detection operation are performed at the same time, since the bridge defect occurs more relatively frequently in the lower word lines (WLB) disposed in the lower part, in the process of applying the program voltage to the lower word lines (WLB) disposed in the lower part, the bridge defect occurring in the lower word lines (WLB) disposed in the lower part is effected to the upper part, and there is a high possibility that the data of the memory cell is damaged in the already programmed upper part.

Accordingly, in the operation of the nonvolatile memory device according to the present embodiment, before programming the data received from the host (HOST) in the order from the upper word lines (WLU) disposed in the upper part of the memory block (BLK) to the lower word lines (WLB) disposed in the lower part, the presence or absence of the bridge defect of the lower word lines (WLB) vulnerable to the defect is checked in advance. Since there should be no problem in the durability of the lower word lines (WLB) in the process of checking such a defect, the presence or absence of the bridge defect on the lower word lines (WLB) is checked, using the first program voltage (V1) which is much smaller than the second program voltage (V2) for programming the data.

When the program is executed in this way, the storage reliability of the data stored in the memory cell can be improved, and since the program operation is immediately stopped if the word line defect is detected, the operation performance of the nonvolatile memory device can also be improved.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A memory device comprising:
   a memory cell array including a first memory cell disposed on a substrate and a second memory cell above the first memory cell;
   a first word line connected to the first memory cell and a second word line connected to the second memory cell, the second word line disposed above the first word line;
   a clock generator configured to generate a pumping clock signal when a pumping voltage is lower than a reference pumping voltage;
   a voltage generator configured to generate the pumping voltage responsive to the pumping clock signal, and generate a first voltage based on the pumping voltage and a second voltage different from the first voltage; and
   a word line defect detection circuit configured to monitor a number of pulses of the pumping clock signal while applying the first voltage to the first word line to detect a defect of the first word line,
   wherein the voltage generator is configured to apply the second voltage to the second word line for programming the second memory cell when the number of pulses of the pumping clock signal is smaller than a reference value, and
   wherein the voltage generator is configured to apply the second voltage to the first word line for programming the first memory cell after the programming of the second memory cell is completed.

2. The memory device of claim 1, wherein the first voltage is smaller than the second voltage.

3. The memory device of claim 1, wherein the first word line comprises a third word line and a fourth word line disposed above the third word line,
   wherein the second word line comprises a fifth word line and a sixth word line disposed above the fifth word line, and wherein a first interval between the third word line and the fourth word line is different from a second interval between the fifth word line and the sixth word line.

4. The memory device of claim 3, wherein the first interval is smaller than the second interval.

5. The memory device of claim 1, wherein the word line defect detection circuit comprises:
a counter configured to count the number of pulses of the pumping clock signal; and
a comparator configured to compare the number of pulses of the pumping clock signal with the reference value to determine whether a defect of the first word line is present or absent.

6. The memory device of claim 1, wherein the voltage generator comprises:
a determination signal generator configured to compare the pumping voltage with a reference pumping voltage to output a determination signal,
wherein the clock generator is configured to generate the pumping clock signal based on the determination signal and a system clock signal.

7. The memory device of claim 1, wherein the word line defect detection circuit is configured to monitor the number of pulses of the pumping clock signal after an erasing operation of a memory block including the first and second memory cells is completed.

8. A method for operating a memory device, the method comprising:
providing a memory cell array including a first memory cell disposed on a substrate, a first word line connected to the first memory cell, a second memory cell disposed above the first memory cell, and a second word line disposed above the first word line and connected to the second memory cell;
generating a pumping clock signal when a pumping voltage is lower than a reference pumping voltage;
generating the pumping voltage responsive to the pumping clock signal, a first voltage based on the pumping voltage, and a second voltage different from the first voltage;
detecting a defect of the first word line by monitoring a first number of pulses of the pumping clock signal while applying the first voltage to the first word line;
when the first number of pulses of the pumping clock signal is smaller than a first reference value, programming the second memory cell by applying the second voltage to the second word line, and
applying the second voltage to the first word line for programming the first memory cell after the programming of the second memory cell is completed.

9. The method of claim 8, further comprising:
performing an erasing operation of a memory block including the first and second memory cells before detecting the defect of the first word line,
wherein, when the erasing operation of the memory block is failed, an operation of detecting the defect of the first word line is not executed, and when the erasing operation of the memory block is passed, the operation of detecting the defect of the first word line is executed.

10. The method of claim 8, wherein the second voltage is greater than the first voltage.

11. The method of claim 8, wherein the programming of the second memory cell comprises:
monitoring a second number of pulses of the pumping clock signal while applying the second voltage to the second word line to detect a defect of the second word line.

12. The method of claim 11, wherein the programming of the second memory cell further comprises:
stopping the program operation of the second memory cell when the second number of pulses of the pumping clock signal is greater than or equal to a second reference value.

13. A memory device comprising:
a memory cell array including a first memory cell disposed on a substrate, a second memory cell disposed above the first memory cell, and a third memory cell disposed above the second memory cell;
a first word line connected to the first memory cell, a second word line connected to the second memory cell, and a third word line connected to the third memory cell, the second word line disposed above the first word line, the third word line disposed above the second word line;
a clock generator configured to generate a pumping clock signal when a pumping voltage is lower than a reference pumping voltage;
a voltage generator configured to generate the pumping voltage responsive to the pumping clock signal, and generate a first program voltage based on the pumping voltage and a second program voltage different from the first program voltage; and
a word line defect detection circuit configured to monitor a first number of pulses of the pumping clock signal while applying the first program voltage to the first word line to detect a defect of the first word line,
wherein, when the first number of pulses of the pumping clock signal is smaller than a first reference value, the word line defect detection circuit is configured to monitor a second number of pulses of the pumping clock signal while applying the first program voltage to the second word line to detect a defect of the second word line, and
wherein the voltage generator is configured to apply the second program voltage to the third word line for programming the third memory cell when the second number of pulses of the pumping clock signal is smaller than the first reference value.

14. The memory device of claim 13, wherein the voltage generator is configured to apply the second program voltage to the second word line for programming the second memory cell after the programming of the third memory cell is completed.

15. The memory device of claim 13, wherein, when the first number of pulses of the pumping clock signal is greater than or equal to the first reference value, the memory device is configured such that a memory block including the first to third memory cells is designated as a bad block.

16. The memory device of claim 13, wherein the word line defect detection circuit is configured to monitor a third number of pulses of the pumping clock signal while applying the second program voltage to the third word line to detect a defect of the third word line.

17. The memory device of claim 13, wherein the first program voltage is smaller than the second program voltage.

18. The memory device of claim 13, wherein the memory device is configured such that an erasing operation of a memory block including the first to third memory cells is completed before the word line defect detection circuit detects the defect of the first word line.

* * * * *